(12) United States Patent
Liu et al.

(10) Patent No.: US 11,081,663 B2
(45) Date of Patent: Aug. 3, 2021

(54) ORGANIC ELECTROLUMINESCENT DISPLAY PANEL WITH AUXILIARY ELECTRODES, METHOD FOR MANUFACTURING THE SAME, AND DISPLAY DEVICE USING THE SAME

(71) Applicant: YUNGU (GU'AN) TECHNOLOGY CO., LTD., Langfang (CN)

(72) Inventors: Rusheng Liu, Kunshan (CN); Bo Yuan, Kunshan (CN); Lin Xu, Kunshan (CN); Genmao Huang, Kunshan (CN); Cuicui Sheng, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/740,492

(22) Filed: Jan. 13, 2020

(65) Prior Publication Data
US 2020/0152901 A1  May 14, 2020

Related U.S. Application Data

(63) Continuation of application No. PCT/CN2019/081793, filed on Apr. 8, 2019.

(30) Foreign Application Priority Data

Jul. 24, 2018 (CN) .................. 201810816716.7

(51) Int. Cl.
*H01L 51/50* (2006.01)
*H01L 27/32* (2006.01)
*H01L 51/52* (2006.01)

(52) U.S. Cl.
CPC ...... *H01L 51/5012* (2013.01); *H01L 27/3218* (2013.01); *H01L 27/3246* (2013.01); *H01L 51/5237* (2013.01)

(58) Field of Classification Search
CPC ............ H01L 51/5012; H01L 27/3218; H01L 27/3246
See application file for complete search history.

(56) References Cited

U.S. PATENT DOCUMENTS 9,018,621 B2   4/2015  Park et al.
9,246,123 B2   1/2016  Kim et al.
(Continued)

FOREIGN PATENT DOCUMENTS

CN   102097448 A   6/2011
CN   103915479 A   7/2014
(Continued)

OTHER PUBLICATIONS

International Search Report of International Patent Application No. PCT/CN2019/081793.
Office Action of Chinese Patent Application No. 201810816716.7.

*Primary Examiner* — Lex H Malsawma
*Assistant Examiner* — Xia L Cross
(74) *Attorney, Agent, or Firm* — Kilpatrick Townsend & Stockton

(57) ABSTRACT

An organic electroluminescent display panel is provided, comprising a planarization layer; a pixel electrode formed on the planarization layer; and an auxiliary electrode coated by the planarization layer. The planarization layer defines a contact hole extending to a top surface of the planarization layer to have the auxiliary electrode contacted with the corresponding pixel electrode. A display device comprising the organic electroluminescent display panel and a method for manufacturing the organic electroluminescent display panel are further provided.

18 Claims, 4 Drawing Sheets

(56) References Cited

U.S. PATENT DOCUMENTS

| | | |
|---|---|---|
| 2013/0005064 A1 | 1/2013 | Park |
| 2014/0312323 A1* | 10/2014 | Park ................. H01L 51/525 257/40 |
| 2016/0172634 A1 | 6/2016 | Kim et al. |
| 2016/0372670 A1* | 12/2016 | Min ................. H01L 51/0005 |
| 2017/0110529 A1 | 4/2017 | Zhang et al. |
| 2019/0074338 A1 | 3/2019 | Gu |
| 2019/0115561 A1* | 4/2019 | Tang ................. H01L 51/5228 |

FOREIGN PATENT DOCUMENTS

| | | |
|---|---|---|
| CN | 204885169 A | 12/2015 |
| CN | 206480628 U | 9/2017 |
| CN | 107394060 A | 11/2017 |
| CN | 107425034 A | 12/2017 |
| CN | 107833906 A | 3/2018 |
| CN | 109037280 A | 12/2018 |

\* cited by examiner

ORGANIC ELECTROLUMINESCENT DISPLAY PANEL WITH AUXILIARY ELECTRODES, METHOD FOR MANUFACTURING THE SAME, AND DISPLAY DEVICE USING THE SAME

CROSS-REFERENCES TO RELATED APPLICATIONS

This application is a continuation to international patent application PCT/CN2019/081793 filed on Apr. 8, 2019, the content of which is hereby incorporated by reference. This application claims all benefits accruing under 35 U.S.C. § 119 from China Patent Application No. 201810816716.7, filed on Jul. 24, 2018 in the National Intellectual Property Administration of China, the content of which is also hereby incorporated by reference.

TECHNICAL FIELD

The present disclosure relates to a field of display technology.

BACKGROUND

An organic light-emitting diode (OLED) display panel, having advantages of small thickness, self-illumination, low power consumption, good flexibility, and so on, has been regarded as a most potential display panel for a display device. People have more and more demands on the size of the active area and the thickness of the OLED display panel for achieving better visual and touch experiences.

SUMMARY

In view of this, there is a need to provide an organic electroluminescent display panel, a method for manufacturing the same, and a display device using the same against the problem that the bending or subjecting of the drop impact of the display panel may induce the display defects.

The organic electroluminescent display panel, provided in the present disclosure, includes a planarization layer; a pixel electrode formed on the planarization layer; and an auxiliary electrode coated by the planarization layer. The planarization layer defines a contact hole extending to a top surface of the planarization layer to have the auxiliary electrode contacted with the corresponding pixel electrode.

In an embodiment, the organic electroluminescent display panel further includes a pixel defining layer covering at least a part of a marginal region of the pixel electrode to define a plurality of pixel defining openings receiving a plurality of organic light emitting units.

In an embodiment, the pixel defining layer has a pixel spacing region located between the plurality of pixel defining openings, and the contact hole is located corresponding to the pixel spacing region.

In an embodiment, the planarization layer is patterned by a patterning process to form a plurality of contact holes surrounding the pixel defining opening.

In an embodiment, a distance from the planarization layer to a top surface of the pixel defining layer is greater than a distance from the planarization layer to a top surface of the pixel electrode.

In an embodiment, a distribution density of the contact holes in a central region of the display panel is greater than that in a frame-adjacent region of the display panel.

In an embodiment, each pixel electrode is corresponding to one auxiliary electrode.

In an embodiment, each auxiliary electrode defines a hollow region and a joining region surrounding the hollow region, and the contact hole is corresponding to the joining region.

In an embodiment, the organic electroluminescent display panel further includes an array substrate. The planarization layer is formed on the array substrate, and an orthographic projection of the contact hole on the array substrate is located within an orthographic projection of the auxiliary electrode on the array substrate.

In an embodiment, the contact hole has a first end away from the auxiliary electrode and a second end adjacent to the auxiliary electrode, and a radial size of the contact hole is gradually reduced from the first end to the second end.

In an embodiment, the contact hole is filled with a pixel electrode material to contact the pixel electrode with the auxiliary electrode.

In an embodiment, the planarization layer includes a first planarization layer and a second planarization layer stacked one by one. The auxiliary electrode is disposed on the first planarization layer and covered by the second planarization layer. The second planarization layer defines the contact hole to expose a part of the auxiliary electrode.

In an embodiment, the auxiliary electrode includes a first auxiliary electrode and a second auxiliary electrode spaced from each other along an up-to-down direction and disposed in the planarization layer. The second auxiliary electrode contacts the corresponding pixel electrode via the contact hole. The planarization layer further defines a joint hole to have the first auxiliary electrode and the second auxiliary electrode joined to each other.

In an embodiment, the contact hole and the joint hole are staggered with each other in a direction parallel to the array substrate.

In an embodiment, the pixel electrode and the auxiliary electrode are joined to each other via the contact hole to form a three-dimensional network structure to support the pixel electrode.

The display device, provided by the present disclosure, includes the organic electroluminescent display panel as described above and a control unit configured to transmit a display signal to the organic electroluminescent display panel.

The method for manufacturing the organic electroluminescent display panel, provided by the present disclosure, includes forming an auxiliary electrode and a planarization layer, wherein the planarization layer is configured to coat the auxiliary electrode and define a contact hole extending to a top surface of the planarization layer; and forming the pixel electrode on the planarization layer, and contacting the auxiliary electrode with the corresponding pixel electrode via the contact hole.

In an embodiment, the forming the auxiliary electrode and the planarization layer includes forming a first planarization layer; forming the auxiliary electrode on the first planarization layer; and forming a second planarization layer on the first planarization layer to coat the auxiliary electrode.

In an embodiment, after the forming the pixel electrode on the planarization layer, the method further includes filling the contact hole with a pixel electrode material.

In an embodiment, after the forming the pixel electrode on the planarization layer, the method further includes forming a pixel defining layer on the planarization layer to cover at least a part of a marginal region of the pixel electrode.

If the organic electroluminescent display panel is repeatedly bent or subjected to a drop impact, a thin film encapsulation layer would be bent along the direction of the applied force, passing the impact force to the pixel electrode. In the organic electroluminescent display panel, the method for manufacturing the same, and the display device using the same of the present disclosure, since a three-dimensional network structure to support the pixel electrode is formed by the pixel electrode and the auxiliary electrode jointed to each other through the contact hole, the stress caused by the impact can be dissipated, thereby preventing break of the pixel electrode or separation of the pixel electrode from the organic light emitting unit. Therefore, the bending strength and the drop impact resistance of the display panel are increased, effectively avoiding the display defect or failure caused by the damage of the pixel electrode.

BRIEF DESCRIPTION OF THE DRAWINGS

Implementations are described by way of example only with reference to the attached figures.

DETAILED DESCRIPTION OF THE INVENTION

Figure 1:
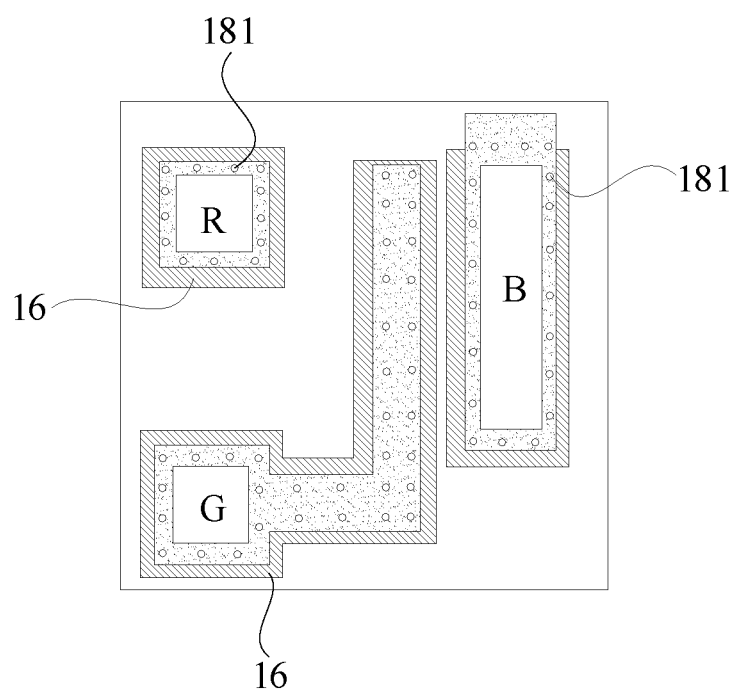
FIG. 1 is a schematic plane view of a pixel region of an organic electroluminescent display panel according to an embodiment of the present disclosure.

In conventional techniques, a larger active area and a smaller thickness are generally accompanied with a lower strength of the OLED display panel. Especially if the flexible OLED display panel is repeatedly bent/folded or is subjected to a drop impact, a stress would tend to be concentrated rather than dissipated, which may easily cause a damage to elements such as an anode, an organic light-emitting unit, or a cathode, consequently, a full color display may unable to be achieved at the bent area or the impacted area, and a display defect phenomenon, such as blackspot, bright spot, or color spot, may occur.

The present disclosure will be described in details in combination with the accompanying drawings for better understanding. The accompanying drawings show preferred embodiments of the present disclosure. However, the present disclosure may be implemented in a plurality of forms or ways, and are not limited to the embodiments described herein. On the contrary, the embodiments described herein are intended to make the disclosure of the present disclosure more clearly and thoroughly understood.

In addition, in the present disclosure, the term "schematic plane view" refers to a schematic view of an object observed from its top. The term "schematic sectional view" refers to a schematic view of an object observed from its side after vertically cutting off a portion of the object from its top so as to expose a section of the object.

An OLED display panel is developed quickly and has been widely used due to its excellent bendable and flexible properties. Comparing with a thin film transistor liquid crystal display (TFT-LCD), the OLED has an important advantage of being applicable for making a bendable, foldable, or rollable product. To achieve a flexible OLED display panel, a flexible substrate is necessary, besides, a thin film encapsulation (TFE) is more appropriate than the widely used glass cover encapsulation.

Generally for the thin film encapsulation, a thin film encapsulation layer can be covered flat on a cathode layer and contact a frame region of an array layer outside an active area of the display panel. However, the OLED display panel usually has a low bending strength and a low drop impact resistance due to factors such as structures and materials.

Taken a drop impact test as an example, if a ball (for example, a steel ball with a weight of 32.65 g and a diameter of 20 mm) is dropped (for example, from a height of 2 cm to 62.5 cm) to strike the OLED display panel, the thin film encapsulation layer would be bent down along the direction of the impact force, and pass a stress caused by the impact force to a structure encapsulated in the thin film encapsulation layer. Since the stress caused by the impact force tends to be concentrated rather than dissipated at the moment when the display panel is struck by the ball, the display panel is easily to be damaged, especially when the ball is dropped from a height of over 10 cm. Consequently, the area struck by the ball may unable to have a full color display, and the defects, such as blackspot, bright spot, or color spot, may occur.

A manner to solve the above problem is to provide a buffer layer at a side, away from a light output side, of the screen body. For example, an optical transparent adhesive can be filled between the display panel and the cover. However, this will thicken the screen body to a certain degree, which is unfavorable to achieve better visual and touch experiences, and will complicate the process and make the fabrication more difficult.

Therefore, there is a need to provide a display panel having increased bending strength and improved drop impact resistance to satisfy the thickness and display effect.

An OLED display panel generally includes an array substrate, an anode (pixel electrode), an OLED light emitting unit, and a cathode. The anode, the light emitting unit, and the cathode are located on the array substrate. The light emitting principle of the OLED is that semiconductor and organic luminescent materials emit lights through carrier injection and combination under an action of an electric filed. More specifically, under a driving voltage, electrons and holes migrate from the cathode and the anode respectively into the OLED light emitting unit, then combine in the OLED light emitting unit to form excitons to excite luminescent molecules, and the luminescent molecules emit visible lights in a radiation relaxation process.

One sub-pixel generally corresponds to one anode. The anode is electrically connected to a drain electrode of a TFT array circuit via a through hole. The TFT array circuit controls each sub-pixel to emit lights or not emit lights. When the panel is impacted or repeatedly bent, the thin film encapsulation would be bent down along the direction of the applied force, passing the stress to the anode. Since the anode is generally a flat metal layer with a poor stress dissipating capability and easy to be separated from the OLED material layer, the anode would be damaged or disabled, thereby causing the display defects.

In the present disclosure, an auxiliary electrode is disposed to provide a compensation so that the stress can be effectively dissipated when the display panel is impacted or repeatedly bent, thereby preventing the damage of the anode or the separation of the anode from the OLED material layer, and increasing the bending strength and the drop impact resistance of the OLED display panel.

The display panel provided by the embodiments of the present disclosure can be mainly applied to a full screen or a frameless display panel, and can also be applied to a display panel having a regular frame or a narrow frame.

Figure 2:
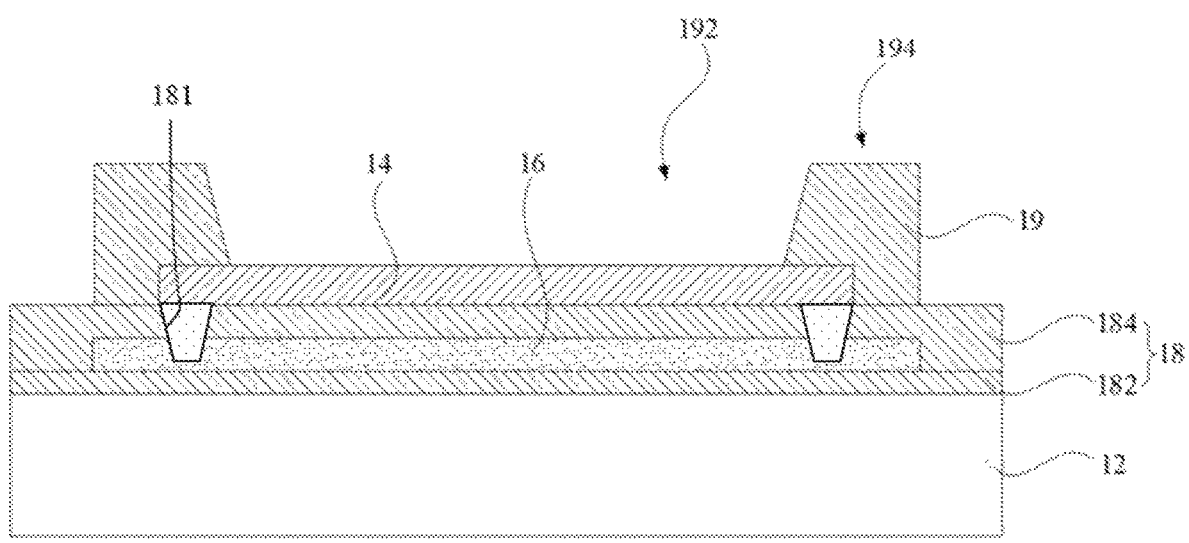
FIG. 2 is a schematic sectional view of a sub-pixel region of the organic electroluminescent display panel according to an embodiment of the present disclosure.

FIG. 1 shows a schematic plane view of a pixel region of an organic electroluminescent display panel of an embodiment of the present disclosure. FIG. 2 shows a schematic sectional view of a sub-pixel region of the organic electroluminescent display panel 10 of an embodiment of the present disclosure.

Referring to FIGS. 1 to 2, an organic electroluminescent display panel 10 of an embodiment of the present disclosure includes an array substrate 12, a pixel electrode 14, an auxiliary electrode 16, and a cathode (not shown). In an embodiment, an organic electroluminescence display panel is an organic light-emitting diode (OLED) display panel.

The display panel 10 has an active area and a non-active area. The active area can be surrounded by the non-active area. In some embodiments, the active area can has a rectangular shape and the non-active area can be configured to surround the rectangular active area. In some other embodiments, the active area and the non-active area can have other shapes and arrangements which are not limited herein. For example, in an embodiment, the display panel 10 is applied to a wearable device, and the active area can have a round shape like a wrist watch. In another embodiment, the display panel 10 is applied to a vehicle, and the active area and the non-active area can have a round shape, a polygonal shape, or other shapes.

An array of pixels can be provided in the active area. Each pixel can include a plurality of sub-pixels. The array substrate 12 has a plurality of sub-pixel regions corresponding to the sub-pixels. For example, in some embodiments, the array substrate 12 can be provided with first sub-pixel regions which emit red lights, second sub-pixel regions which emit blue lights, and third sub-pixel regions which emit green lights. The first sub-pixel region, the second sub-pixel region, and the third sub-pixel region in one group can constitute one pixel region. The pixel electrode 14 can correspond to the corresponding sub-pixel region in a one to one manner.

In some other embodiments, each pixel region can also contain other sub-pixel regions, which is not limited herein. For example, each pixel region can further contain a fourth sub-pixel region emitting white lights.

The sub-pixel is a minimum unit configured to exhibit one color. Each sub-pixel region can be provided with a thin film transistor, the pixel electrode 14, and an organic light emitting unit. The thin film transistor can be configured to transmit a data signal from a data line to the pixel electrode 14, in response to a signal from a gate line, to control a light emission of the sub-pixel.

In an embodiment, the array substrate 12 includes a base substrate (made by, for example, a polyimide material) and the thin film transistor (not shown) disposed on the base substrate. Since the thin film transistor has a complicated layered structure, it is unlikely for the thin film transistor to have a flat top surface. The array substrate 12 can further include a planarization layer 18 configured to form a flat-enough top surface. Through holes can be further defined in the planarization layer 18 to expose a source electrode and a drain electrode of the thin film transistor.

It should be understood that the array substrate 12 can further include other layers or films which are not limited herein, such as an insulating interlayer.

The display panel 10 can further include a pixel defining layer 19 formed on the array substrate 12. The pixel defining layer 19 can define a plurality of pixel defining openings 192 to expose at least a part of each pixel electrode 14. For example, the pixel defining layer 19 can cover at least a part of a marginal region of each pixel electrode 14 to expose at least a part of each pixel electrode 14. In an embodiment, a central portion or the whole of each pixel electrode 14 is exposed via the corresponding pixel defining opening 192. The pixel defining layer 19 can further define a pixel spacing region 194 located between the plurality of pixel defining openings 192.

As such, the pixel defining layer 19 can increase a distance from ends of each pixel electrode 14 to an opposite electrode (cathode) formed above each pixel electrode 14, and prevent an anti-reflection occurred at the ends of the pixel electrode 14.

For example, the pixel electrode 14 can be formed on the planarization layer 18, and a height from the planarization layer 18 to a top surface of the pixel defining layer 19 is greater than a height from the planarization layer 18 to a top surface of the pixel electrode 14. The pixel defining layer 19 can cover at least a part of the marginal region of each pixel electrode 14 to form a plurality of pixel defining openings 192. The organic light emitting unit is filled in the pixel defining opening 192.

The cathode as an integrated piece can cover the pixel defining layer 19. The cathode can be made of a low work function metal, such as silver, lithium, magnesium, calcium, strontium, aluminum, indium, and the like, or made of a metallic compound or an alloy material. In some embodiments, the cathode can be formed by a vapor deposition to cover the organic light emitting units located inside the pixel defining openings 192 and the pixel spacing regions 194 located between the plurality of pixel defining openings 192.

The auxiliary electrode 16 can be coated by the planarization layer 18. The planarization layer 18 can define a contact hole 181 extending to a top surface of the planarization layer 18 to have the auxiliary electrode 16 contacted with the corresponding pixel electrode 14. The auxiliary electrode 16 located under the corresponding pixel electrode 14 can be exposed from the contact hole 181, so that the subsequently formed pixel electrode 14 can be jointed to the auxiliary electrode 16 via the contact hole 181.

The planarization layer 18 can be patterned by a patterning process to form the contact hole 181. For example, in an embodiment, the contact hole 181 can be formed by performing exposure and development operations for the planarization layer 18 on which a mask is provided. In another embodiment, the contact hole 181 can be formed by an etching process. It should be understood that the contact hole 181 can also be formed by other patterning methods which are not limited herein.

The auxiliary electrode 16 being coated by the planarization layer 18 refers to that the auxiliary electrode 16 is located in and enclosed by the planarization layer 18. That is, all surfaces of the auxiliary electrode 16 are coated by the planarization layer 18. For example, the planarization layer 18 can include a first planarization layer 182 and a second planarization layer 184 stacked one by one. The auxiliary electrode 16 can be formed on the first planarization layer 182 and then covered by the second planarization layer 184. The contact hole 181 can be formed on the second planarization layer 184 to expose a part of the auxiliary electrode 16.

Since the thin film transistor has a complicated layered structure, it is unlikely for the thin film transistor to have a flat top surface. An insulating interlayer is usually disposed on the top surface of the thin film transistor (for insulating and passivating). The insulating interlayer is generally made of a lamination of silicon nitride and silicon oxide. Therefore, it is difficult for the insulating interlayer to have a flat surface. However, the light output efficiency of the pixel is directly influenced by the flatness of the surface of the pixel electrode 14. Therefore, the auxiliary electrode 16 is better to be disposed in the planarization layer 18.

If the display panel 10 is repeatedly bent or is subjected to a drop impact, the thin film encapsulation layer would be bent down along the direction of the applied force, and the impact force would be passed to the pixel electrode 14. Since the auxiliary electrode 16 and the pixel electrode 14 are joined together to form a three-dimensional network structure, the pixel electrodes 14 would be supported by the three-dimensional network structure and thus the stress caused by the impact force would be dissipated. As such, the break of the pixel electrode 14 and the separation of the pixel electrode 14 from the organic light emitting unit would be prevented, and the display defects or failure caused by the damage of the pixel electrode 14 would be effectively avoided.

In this way, the bending strength and the drop impact resistance of the display panel 10 are increased.

The number of the contact holes 181 can be decided according to needs and is not limited herein. For example, a distribution density of the contact holes 181 can be appropriately increased in the central region of the display panel 10 because the central region is easier to be damaged by the drop impact, while the distribution density of the contact holes 181 can be appropriately decreased in a frame-adjacent region of the display panel 10.

A cross-sectional shape of the contact hole 181 can be a circle, a square, a rectangle, and other shapes, and is not limited herein as long as the subsequently vapor-deposited pixel electrode 14 can be joined to the auxiliary electrode 16 through the contact hole 181.

The auxiliary electrode 16 can be made of a material the same as or different from that of the pixel electrode 14. The pixel electrode 14 can be a transparent electrode, a semi-transparent electrode, or a reflective electrode. For example, the pixel electrode 14 is a transparent electrode, and the auxiliary electrode 16 can be made of a material the same as that of the pixel electrode 14, including indium tin oxide (ITO), indium zinc oxide, zinc oxide, indium trioxide, indium potassium oxide, aluminum zinc oxide, or the like. A material of the pixel electrode 14 as the reflective electrode can include silver, magnesium, aluminum, platinum, gold, nickel, or the like.

The flatness of a surface, away from the array substrate 12, of the planarization layer 18 may be affected by the auxiliary electrode 16 located in the planarization layer 18 under the restriction of manufacturing techniques. On one hand, the pixel electrode 14 is formed on the planarization layer 18, and a micro-cavity can be formed between the pixel electrode 14 and the cathode, such that the light output efficiency can be enhanced because lights emitted by the organic light emitting unit are reflected back and forth between the pixel electrode 14 and the cathode, inducing the amplification and the constructive interference of the lights. Therefore, the light output efficiency of the OLED is affected directly by the flatness of the planarization layer 18. On the other hand, the OLED materials configured to emit lights with different colors are generally deposited in respective sub-pixel regions by using a mask with a plurality of small through holes, so as to form the organic light emitting units. However, the through holes of the mask are getting smaller and arranged more intensive with the increase of the resolution of the organic electroluminescent display panel, therefore, the flatness of the surface, away from the array substrate 12, of the planarization layer 18 may affect the forming of the organic light emitting unit.

In an embodiment, the contact hole 181 can be located corresponding to the pixel spacing region located between the plurality of pixel defining openings 192, so that a joint between the pixel electrode 14 and the auxiliary electrode 16 can be located outside a region corresponding to the pixel defining opening 192, thereby reducing the influence of the flatness of the surface, away from the array substrate 12, of the planarization layer 18 on the pixel electrode 14 located in the region corresponding to the pixel defining opening 192 and on the organic light emitting unit, thereby improving the reliability of the display panel 10. In some other embodiments, the auxiliary electrode 16 can be located in a region corresponding to the pixel spacing region 194 and the pixel defining opening 192, and is not limited herein.

In an embodiment, a plurality of contact holes 181 can be defined surrounding the region corresponding to the pixel defining opening 192, so that a three-dimensional supporting structure containing a plurality of columns can be formed to well support the pixel electrode 14, especially the portion of the pixel electrode 14 exposed by the pixel defining opening 192, thereby further preventing the break of the pixel electrode 14 or the separation of the pixel electrode 14 from the organic light emitting unit. In an embodiment, each auxiliary electrode 16 corresponds to one pixel electrode 14, so that all pixel electrodes 14 can be supported well to further preventing the break of the pixel electrode 14 or the separation of the pixel electrode 14 from the organic light emitting unit.

The auxiliary electrode 16, as an integrated piece located under the pixel electrode 14, may form a light shade affecting the light output efficiency. A hollow pattern can be formed on the auxiliary electrode 16 to increase the light output efficiency, however, this would influence the supporting strength to the pixel electrode 14 and dissipating effect for the stress. In an embodiment, each auxiliary electrode 16 defines one hollow region and a joining region surrounding the hollow region, the joining region can be in shape of a closed ring, and the contact hole 181 can be defined corresponding to the joining region, so that not only the influence to the light output efficiency is decreased, but also the pixel electrode 14 can be well supported and the stress caused by an impact can be well dissipated, thereby further preventing the break of the pixel electrode 14 and the separation of the pixel electrode 14 from the organic light emitting unit.

The pixel electrode 14 can be connected to the drain electrode of the thin film transistor via a through hole, and interference between this through hole and the auxiliary electrode 16 should be avoided to ensure the yield of the display panel 10.

Generally, different sub-pixels, for emitting lights with different colors, have different shapes and sizes to achieve a better display effect, and the pixel electrodes 14, corresponding to the different sub-pixels, can also have different shapes and sizes. The auxiliary electrode 16 matches with the corresponding pixel electrode 14 in shape and size. For example, if a shape of a pixel electrode 14 of a sub-pixel that emits red lights is rectangle, an auxiliary electrode 16 corresponding to the pixel electrode 14 can also has a rectangular shape. The hollow region of the auxiliary electrode 16 corresponds to the pixel defining opening 192 of that red sub-pixel, and the contact holes 181 corresponds to the joining region of the auxiliary electrode 16 and surrounds the region corresponding to pixel defining opening 192.

Considering the restriction of the manufacturing techniques, there should be a tolerance allowing the pixel electrode 14 to be stably joined with the auxiliary electrode 16. In an embodiment, an orthographic projection of the contact hole 181 on the array substrate 12 can be located within an orthographic projection of the auxiliary electrode 16 on the array substrate 12. In an embodiment, the projection of the contact hole 181 on the array substrate 12 can be located within a projection of the joining region of the auxiliary electrode 16 on the array substrate 12.

As such, the joining stability between the pixel electrode 14 and the auxiliary electrode 16 through the contact hole 181 can be ensured.

In some embodiments, the contact hole 181 has a first end away from the auxiliary electrode 16 and a second end adjacent to the auxiliary electrode 16. A radial size of the contact hole 181 can be decreased gradually from the first end to the second end, so that the pixel electrode 14 can be deposited well, through vapor deposition or ink-jet printing in the subsequent deposition process, into the contact hole 181 so as to form a good contact between the auxiliary electrode 16 and the pixel electrode 14.

It should be noted that the radial size of the contact hole 181 decreasing gradually from the first end to the second end does not mean that the radial size of the contact hole 181 has to be changed linearly. In some embodiments, the radial size of the contact hole 181 can has a stepped variation from the first end to the second end, and is not limited herein.

Figure 3:
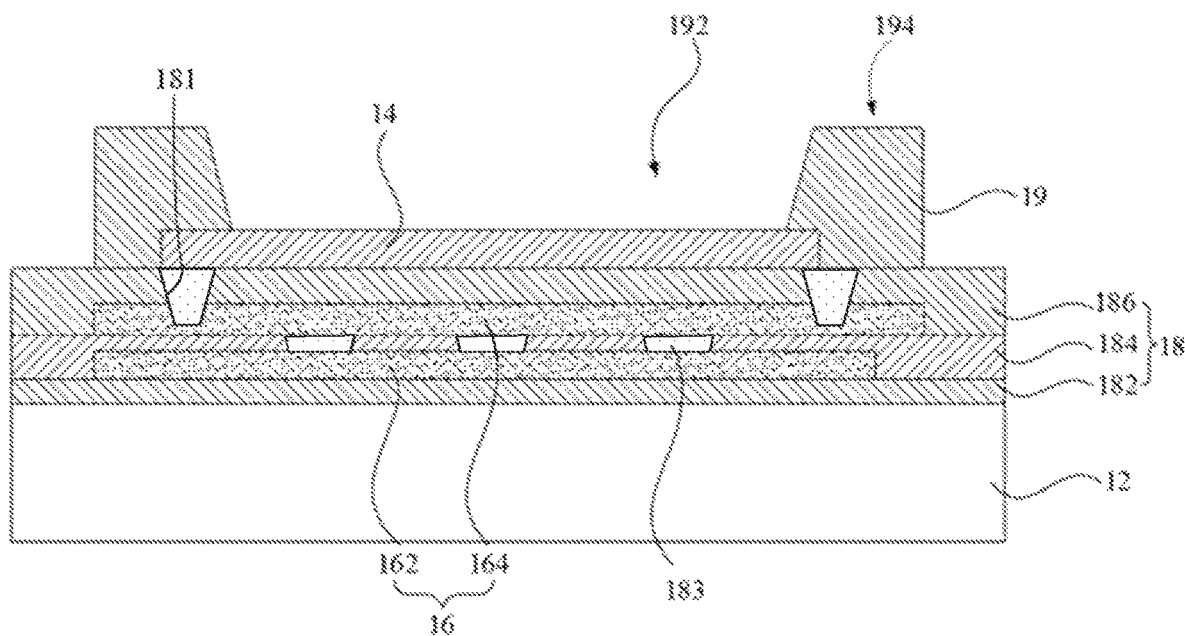
FIG. 3 is a schematic sectional view of a sub-pixel region of the organic electroluminescent display panel according to another embodiment of the present disclosure.

FIG. 3 shows a schematic sectional view of a sub-pixel region of an organic electroluminescent display panel 20 according to another embodiment of the present disclosure.

Referring to FIG. 3, in an embodiment, the auxiliary electrode 16 can include a first auxiliary electrode 162 and a second auxiliary electrode 164 spaced from each other along an up-to-down direction and disposed in the planarization layer 18. The second auxiliary electrode 164 can contact the corresponding pixel electrode 14 via the contact hole 181. The planarization layer 18 can further define a joint hole 183 to have the first auxiliary electrode 162 and the second auxiliary electrode 164 joined to each other.

The planarization layer 18 can include a first planarization layer 182, a second planarization layer 184, and a third planarization layer 186 stacked one by one. In an embodiment, the first planarization layer 182 is formed on an insulating interlayer; the first auxiliary electrode 162 is formed on the first planarization layer 182 and covered by the second planarization layer 184; the second planarization layer 184 defines a joint hole 183 to expose a part of the first auxiliary electrode 162; the second auxiliary electrode 164 is formed on the second planarization layer 184 and covered by the third planarization layer 186; and the first auxiliary electrode 162 and the second auxiliary electrode 164 are joined together via the one or more joint holes 183. The third planarization layer 186 defines the contact hole 181 to expose a part of the second auxiliary electrode 164. The pixel electrode 14 is formed on the third planarization layer 186 and joined with the second auxiliary electrode 164 via the contact hole 181.

As such, a three-dimensional network structure can be constructed by joining the auxiliary electrodes 16, and joining the pixel electrode 14 with the auxiliary electrode 16, to support the pixel electrode 14 and dissipate the stress, thereby preventing the break of the pixel electrode 14 and the separation of the pixel electrode 14 from the organic light emitting unit and avoiding the display defects and failure.

In an embodiment, the contact hole 181 and the joint hole 183 are staggered with each other in a direction parallel to the array substrate 12. In an embodiment, an orthographic projection of the joint hole 183 on the array substrate 12 is located within a region surrounded by the orthographic projections of the plurality of contact holes 181 on the array substrate 12, so that the pixel electrode 14 can be supported well and the stress can be dissipated, thereby avoiding the defects or failure of display caused by the damage of the pixel electrode 14.

Figure 4:
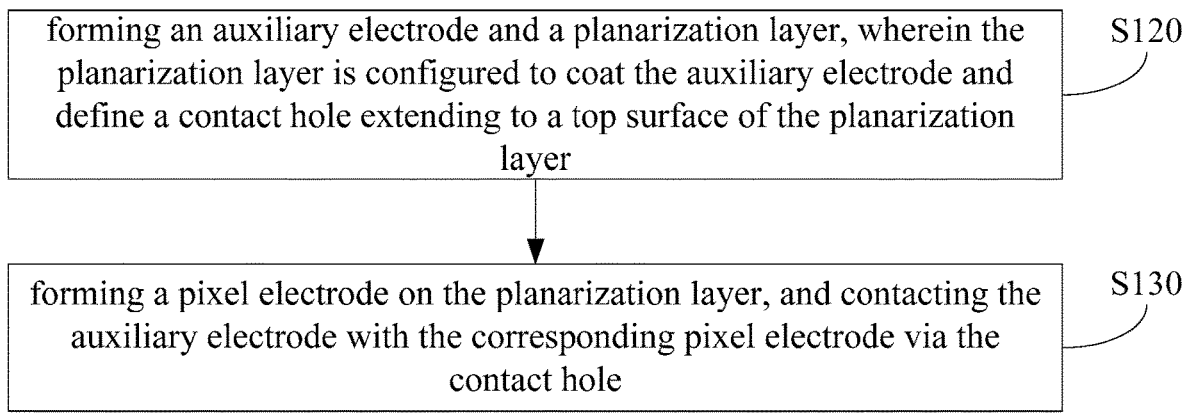
FIG. 4 shows a flowchart of a method for manufacturing the organic electroluminescent display panel according to an embodiment of the present disclosure.

A method for manufacturing the organic electroluminescent display panel is further provided in the embodiments of the present disclosure. FIG. 4 shows a flowchart of the method for manufacturing the organic electroluminescent display panel in an embodiment of the present disclosure. The method for manufacturing the organic electroluminescent display panel includes:

S120, forming the auxiliary electrode 16 and the planarization layer 18, wherein the planarization layer 18 is configured to coat the auxiliary electrode 16 and define a contact hole extending to a top surface of the planarization layer; and S130, forming the pixel electrode 14 on the planarization layer 18, and contacting the auxiliary electrode 16 with the corresponding pixel electrode 14 via the contact hole 181.

In an embodiment, the S120 can include: forming the first planarization layer 182 on the insulating interlayer; forming the auxiliary electrode 16 on the first planarization layer 182 by, for example, vapor deposition or printing; and forming the second planarization layer 184 on the first planarization layer 182 to coat the auxiliary electrode 16.

The auxiliary electrode 16 can be formed corresponding to the pixel spacing region 194 between the plurality of pixel defining openings 192 of the pixel defining layer 19.

The second planarization layer 184 can be patterned by a patterning process to form the contact holes 181.

In an embodiment, a mask can be provided on the second planarization layer 184 and then the second planarization layer 184 can be exposed and developed to form the plurality of contact holes 181. In another embodiment, the second planarization layer 184 can be etched to form the plurality of contact holes 181. It should be noted that the plurality of contact holes 181 can also be formed by other patterning methods.

A plurality of contact holes 181 can be only distributed in a plane and surround the region corresponding to each pixel defining opening 192, and/or can be aligned along an extending direction of the pixel electrode 14, so that the pixel electrode 14 can be supported well.

In an embodiment of S130, the pixel electrode 14 (i.e. the anode) is formed on the second planarization layer 184. The array substrate 12 can have a plurality of sub-pixel regions and a spacing region located between the plurality of sub-pixel regions. One sub-pixel can correspond to one sub-pixel region. For example, the pixel electrode for emitting the red lights, the pixel electrode for emitting the green lights, and the pixel electrode for emitting the blue lights can be respectively located in a sub-pixel region.

The contact hole 181 can be filled with the pixel electrode material to contact the pixel electrode 14 to the auxiliary electrode 16. In an embodiment, the pixel electrode 14 is a transparent electrode, and the auxiliary electrode 16 can be made of a material the same as that of the pixel electrode 14, including indium tin oxide (ITO), indium zinc oxide, zinc oxide, indium trioxide, indium potassium oxide, aluminum zinc oxide, or the like. A material of the pixel electrode 14 as the reflective electrode can include silver, magnesium, aluminum, platinum, gold, nickel, or the like.

In an embodiment, after the formation of the pixel electrode 14, the pixel defining layer 19 is formed on the second planarization layer 184 to cover at least a part of the marginal region of each pixel electrode 14 and expose at least a portion of each pixel electrode 14. As such, the pixel defining layer 19 defines a plurality of pixel defining openings 192 and a pixel spacing region 194 located between the plurality of pixel defining openings 192. The central portion or the whole pixel electrode 14 can be exposed from the corresponding pixel defining opening 192.

In an embodiment, the method further includes:

S110, providing an array substrate 12.

The array substrate 12 can include a base substrate and a thin film transistor.

Taken a flexible display panel as an example, the base substrate can be formed on a supporting substrate. The base substrate can be a flexible substrate. Optionally, the base substrate can be made of an organic polymer, silicon nitride, or silicon oxide. The organic polymer can be selected from polyimide, polyamide, polycarbonate, polyether sulphone, and any combinations thereof. In an embodiment, a polyimide solution is coated on the supporting substrate and then cured to form the base substrate.

The thin film transistor is formed on the base substrate. In an embodiment, before forming the thin film transistor on the base substrate, one or more additional layers such as a buffer layer can be formed on the base substrate. The buffer layer can cover the entire top of the base substrate, or a patterned buffer layer can be formed on the base substrate.

The buffer layer can be made of an appropriate material, such as polyethylene terephthalate (PET), polyethylene naphthalate (PEN), polyacrylate, polyimide, or any combinations thereof. The buffer layer can be a single layer or a layered structure formed by a plurality of stacked layers. The buffer layer can also be made of silicon oxide or silicon nitride, or a composite layer including organic and/or inorganic materials.

The thin film transistor is configured to control the emission of the sub-pixel, for example, to control an amount of lights emitted by the sub-pixel. The thin film transistor can include a semiconductor layer, a gate electrode, a source electrode, and a drain electrode. The semiconductor layer can be an amorphous silicon layer, a metal oxide layer, a polycrystalline silicon layer, or an organic semiconductor layer. In an embodiment, the semiconductor layer includes a channel region, doped source region, and doped drain region.

A gate insulating layer can be covered on the semiconductor layer, and the gate electrode can be located on the gate insulating layer. The gate insulating layer can cover substantially the entire top of the base substrate. In an embodiment, the gate insulating layer is formed by a pattern process. Considering the bonding to the adjacent layers, the formability of the layers stacked together, and the surface flatness, the gate insulating layer can be made of an insulating organic or inorganic material, such as silicon oxide, silicon nitride, and the like. The gate electrode can be covered by an insulating interlayer made of an insulating organic or inorganic material, such as silicon oxide, silicon nitride, and the like. A portion of the gate insulating layer and a portion of the insulating interlayer can be removed in order to form a contact hole to expose the predetermined region of the semiconductor layer. The source and drain electrodes can contact the semiconductor layer via the contact hole.

The array substrate 12 can further include an insulating interlayer to insulate the gate electrode from the source and drain electrodes of the thin film transistor. The array substrate 12 can further include a planarization layer 18 with a substantially planer top surface to cover the thin film transistor.

A display device is further provided in the present disclosure, the display device can include the display panel as described above. In an embodiment, the display device can be a display terminal, such as a tablet computer. In another embodiment, the display device can be a mobile communication terminal, such as a mobile terminal.

In an embodiment, the display device can include the display panel and a control unit configured to transmit a display signal to the display panel.

In the present disclosure, if the display panel is repeatedly bent or subjected to a drop impact, thin film encapsulation layer would be bent down along the direction of the applied force and pass the impact force to the pixel electrode 14. Since a three-dimensional network structure is formed by the pixel electrode 14 and the auxiliary electrode 16 joined to each other, the stress caused by the impact force can be dissipated well, thereby preventing the break of the pixel electrode 14 or the separation of the pixel electrode 14 from the organic light emitting unit. Therefore, the bending strength and the drop impact resistance of the display panel are increased, and effectively avoiding the display defect or failure caused by the damage of the pixel electrode 14.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present disclosure.

What described above are only several implementations of the present disclosure, and these embodiments are specific and detailed, but not intended to limit the scope of the present disclosure. It should be understood by the skilled in the art that various modifications and improvements can be made without departing from the conception of the present disclosure, and all fall within the protection scope of the present disclosure. Therefore, the patent protection scope of the present disclosure is defined by the appended claims.

The invention claimed is:

1. An organic electroluminescent display panel, comprising:
    a plurality of sub-pixels, wherein each of the plurality of sub-pixels comprises:
        a planarization layer;
        a pixel electrode formed on the planarization layer;
        an auxiliary electrode coated by the planarization layer, wherein the auxiliary electrode is continuous and the pixel electrode overlaps the auxiliary electrode;
        a pixel defining layer covering at least a part of a marginal region of the pixel electrode to define a pixel defining opening exposing at least a part of the pixel electrode,
    wherein the planarization layer defines a plurality of contact holes extending to a top surface of the planarization layer to have the auxiliary electrode in direct contact with the pixel electrode through each of the plurality of contact holes, wherein the plurality of contact holes surround the pixel defining opening, and an array substrate, wherein the planarization layer is formed on the array substrate, and orthographic projections of the plurality of contact holes on the array substrate are all located within an orthographic projection of the auxiliary electrode on the array substrate.

2. The organic electroluminescent display panel of claim 1, wherein the orthographic projections of the plurality of contact holes on the array substrate are all located within an orthographic projection of the pixel defining layer.

3. The organic electroluminescent display panel of claim 1, wherein the planarization layer is patterned by a patterning process to form the plurality of contact holes surrounding the pixel defining opening.

4. The organic electroluminescent display panel of claim 1, wherein a distance from the planarization layer to a top surface of the pixel defining layer is greater than a distance from the planarization layer to a top surface of the pixel electrode.

5. The organic electroluminescent display panel of claim 1, wherein a distribution density of the plurality of contact holes in a central region of the display panel is greater than that in a frame-adjacent region of the display panel.

6. The organic electroluminescent display panel of claim 1, wherein the each of the plurality of contact holes has a first end away from the auxiliary electrode and a second end adjacent to the auxiliary electrode, and a radial size of the each of the plurality of contact holes is gradually reduced from the first end to the second end.

7. The organic electroluminescent display panel of claim 1, wherein the each of the plurality of contact holes is filled with a pixel electrode material to contact the pixel electrode with the auxiliary electrode.

8. The organic electroluminescent display panel of claim 1, wherein the planarization layer comprises a first planarization layer and a second planarization layer stacked one by one, the auxiliary electrode is disposed on the first planarization layer and covered by the second planarization layer, and the second planarization layer defines the plurality of contact holes to expose a part of the auxiliary electrode.

9. The organic electroluminescent display panel of claim 1, wherein the auxiliary electrode includes a first auxiliary electrode and a second auxiliary electrode spaced from each other along an up-to-down direction and disposed in the planarization layer, the second auxiliary electrode contacts the pixel electrode via the plurality of contact holes, and the planarization layer further defines a joint hole to have the first auxiliary electrode and the second auxiliary electrode joined to each other.

10. The organic electroluminescent display panel of claim 9, wherein the plurality of contact holes and the joint hole are staggered with each other in a direction parallel to an array substrate of the display panel.

11. The organic electroluminescent display panel of claim 9, wherein the pixel electrode and the auxiliary electrode are joined to each other via the plurality of contact holes to form a three-dimensional network structure to support the pixel electrode.

12. A display device, comprising:

an organic electroluminescent display panel, comprising:

a sub-pixel, wherein the sub-pixel comprises:

a planarization layer;

a pixel electrode formed on the planarization layer;

an auxiliary electrode coated by the planarization layer, wherein the auxiliary electrode is continuous and the pixel electrode overlaps the auxiliary electrode;

a pixel defining layer covering at least a part of a marginal region of the pixel electrode to define a pixel defining opening exposing at least a part of the pixel electrode, wherein the planarization layer defines a plurality of contact holes extending to a top surface of the planarization layer to have the auxiliary electrode directly contacted with the pixel electrode through each of the plurality of contact holes, wherein the plurality of contact holes surround the pixel defining opening; and an array substrate, wherein the planarization layer is formed on the array substrate, and orthographic projections of the plurality of contact holes on the array substrate are all located within an orthographic projection of the auxiliary electrode on the array substrate; and a control unit configured to transmit a display signal to the organic electroluminescent display panel.

13. The display device of claim 12, wherein the orthographic projections of the plurality of contact holes on the array substrate are all located within an orthographic projection of the pixel defining layer.

14. The display device of claim 12, wherein the planarization layer is patterned by a patterning process to form the plurality of contact holes surrounding the pixel defining opening.

15. The display device of claim 12, wherein a distance from the planarization layer to a top surface of the pixel defining layer is greater than a distance from the planarization layer to a top surface of the pixel electrode.

16. A method for manufacturing a sub-pixel of an organic electroluminescent display panel, comprising:

providing an array substrate;

forming an auxiliary electrode and a planarization layer, wherein the planarization layer is configured to coat the auxiliary electrode and define a plurality of contact holes extending to a top surface of the planarization layer, wherein the auxiliary electrode is continuous; and forming a pixel electrode on the planarization layer, wherein the pixel electrode overlaps the auxiliary electrode, and directly contacting the auxiliary electrode with the pixel electrode via each of the plurality of contact holes, forming a pixel defining layer on the planarization layer to cover at least a part of a marginal region of the pixel electrode to define a pixel defining opening exposing at least a part of the pixel electrode, wherein the plurality of contact holes surround the pixel defining opening, and wherein the planarization layer is formed on the array substrate, and orthographic projections of the plurality of contact holes on the array substrate are all located within an orthographic projection of the auxiliary electrode on the array substrate.

17. The method of claim 16, wherein the forming the auxiliary electrode and the planarization layer comprises: forming a first planarization layer; forming the auxiliary electrode on the first planarization layer; and forming a second planarization layer on the first planarization layer to coat the auxiliary electrode.

18. The method of claim 16, after the forming the pixel electrode on the planarization layer, further comprising: filling the each of the plurality of contact holes with a pixel electrode material.

* * * * *